(12) United States Patent
Penberth et al.

(10) Patent No.: US 6,278,124 B1
(45) Date of Patent: Aug. 21, 2001

(54) ELECTRON BEAM BLANKING METHOD AND SYSTEM FOR ELECTRON BEAM LITHOGRAPHIC PROCESSING

(75) Inventors: Michael J. Penberth; Graham S. Plows; Adam Woolfe, all of Cambridgeshire (GB)

(73) Assignee: DuPont Photomasks, Inc, Round Rock, TX (US)

( * ) Notice: Subject to any disclaimer, the term of this patent is extended or adjusted under 35 U.S.C. 154(b) by 0 days.

(21) Appl. No.: 09/261,594

(22) Filed: Mar. 3, 1999

Related U.S. Application Data
(60) Provisional application No. 60/076,889, filed on Mar. 5, 1998.

(51) Int. Cl.[7] .................................................. A61N 5/00
(52) U.S. Cl. ................ 250/492.22; 250/396; 250/492.21
(58) Field of Search ........................ 250/492.22, 492.21, 250/396

(56) References Cited

U.S. PATENT DOCUMENTS

| | | | |
|---|---|---|---|
| 4,367,411 | 1/1983 | Hanley et al. | 250/492.2 |
| 4,434,371 | 2/1984 | Knauer | 250/396 |
| 4,445,041 | 4/1984 | Kelly et al. | 250/505.1 |
| 5,345,085 | 9/1994 | Prior | 250/491.1 |
| 5,412,218 | 5/1995 | Gesley et al. | 250/396 |
| 5,976,392 | * 11/1999 | Chen | 216/16 |
| 5,995,878 | * 11/1999 | Miyajima | 700/121 |
| 6,163,032 | * 12/2000 | Rockwood | 250/396 R |

* cited by examiner

Primary Examiner—Teresa M. Arroyo
Assistant Examiner—K Fernandez
(74) Attorney, Agent, or Firm—Gray Gary Ware & Friedenrich

(57) ABSTRACT

An electron beam blanking method and system for selectively interrupting the flow of electrons during an electron beam lithographic process minimizes electron beam movement during blanking as the electron beam reaches a target lithographic mask. A first deflection plate pair deflects electrons flowing in the electron beam in the direction of the target lithographic mask. The first deflection plate pair includes a first tapered gap that is formed so that electrons which enter the first tapered gap before the initialization of a blanking voltage experience progressively greater electric field as they pass through the plates for controlling the cumulative deflection as the electrons travel through the first deflection plate pair. A second deflection plate pair further deflects electrons flowing in the electron beam in the direction of the target lithographic mask and includes a second tapered gap for further variably controlling the commutative deflection of the electron beam traveling through the second tapered gap. One or more hybrid integrated circuits provide deflection voltages to the first and second deflection plate pairs for varying the respective degree of electron beam deflection.

11 Claims, 11 Drawing Sheets

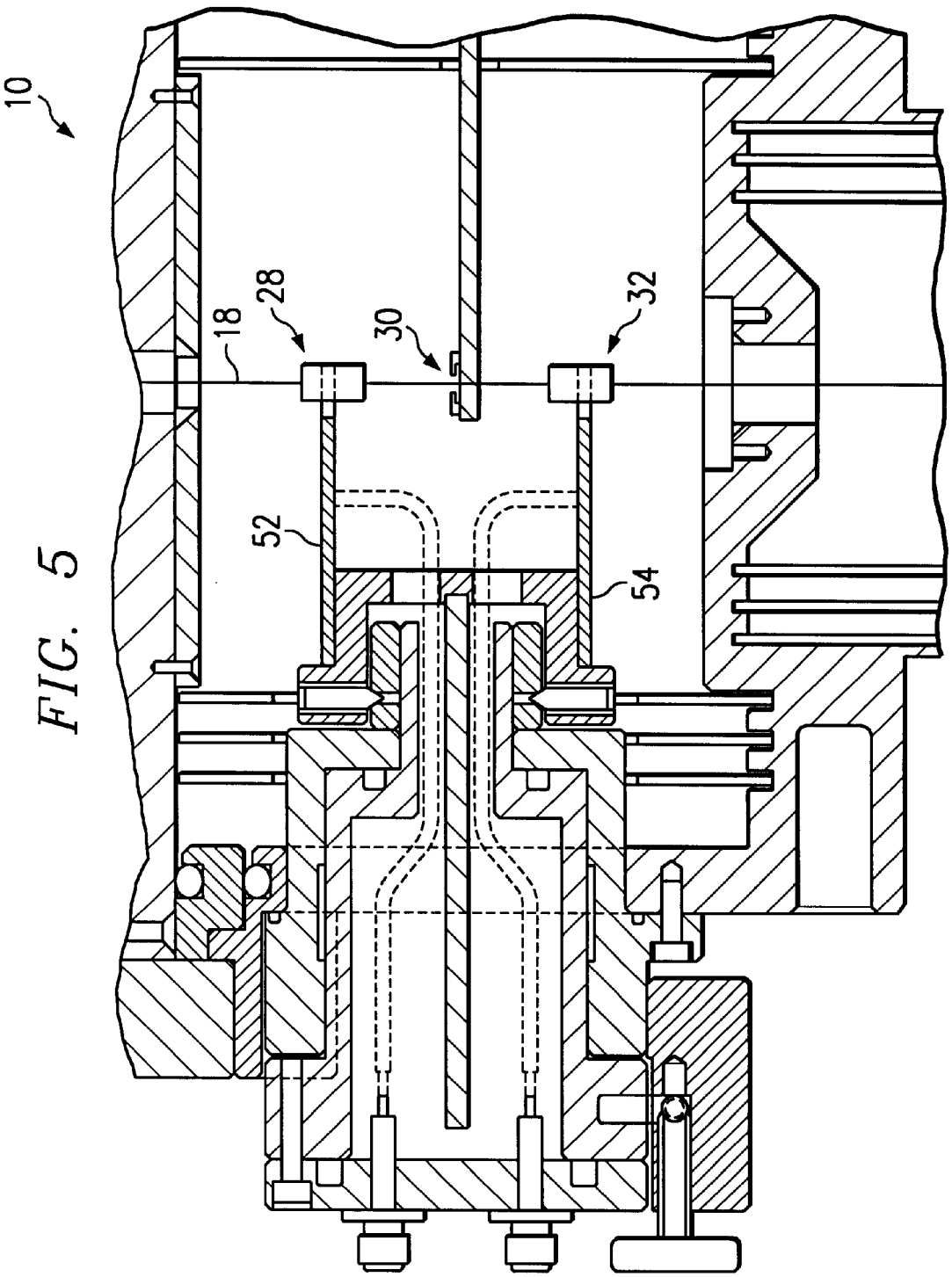

ELECTRON BEAM BLANKING METHOD AND SYSTEM FOR ELECTRON BEAM LITHOGRAPHIC PROCESSING

This application claims benefit to Provisional Application No. 60/076,889 filed Mar. 5, 1998.

TECHNICAL FIELD OF THE INVENTION

The present invention relates to electron beam lithography methods and systems used in the manufacture of semiconductor devices on semiconductor wafers and, more particularly, to a method, apparatus, and system for electron beam blanking in the operation of such electron beam lithography systems and, even more particularly, to an electron beam blanking method and system that eliminates or substantially reduces undesired movement of the electron beam while being blanked, during high-speed electron beam lithographic processing.

BACKGROUND OF THE INVENTION

Electron beam lithography is widely used in the manufacture of semiconductor devices on silicon and other semiconductor wafers. The electron beam is capable, because of its small wavelength, of exposing patterns in a suitable electron resist which are smaller than those which can be made with visible or ultra-violet light. The electron beam is also easily steered by a time varying deflection voltage or current to expose the pattern.

It has two main drawbacks compared with light for lithography. Firstly the electron beam forming components, usually stacked above each other, with the gun at the top and the exposure surface at the bottom, and with lenses, apertures and other components between, the whole being therefore known as the 'electron beam column', or simply the 'column', must operate on the beam in high vacuum, whereas light can be used in air. Secondly electron optical lenses have very large aberrations compared with light lenses, which have made it so far impractical to use electron beam projection systems in which a patterned mask is placed in the path of the beam, thus causing a negative of this pattern to be projected on the resist surface to be exposed. Projection systems using light on the other hand are commonly used in lithography.

In high throughput lithography therefore it is common to combine the virtues of the electron beam with those of light. First the electron beam is used to produce a mask or reticle which bears the pattern, by exposing electron resist coated on to the mask surface. This is done by serial movement of a small focused electron beam to expose the pattern pixel by pixel. Secondly a light based system is used to expose in photoresist coated on the surface of the semiconductor wafer an image of the previously exposed and developed mask by allowing the light to pass through that pattern. Thus the pattern for a given layer on the semiconductor wafer can be exposed in one light exposure taking a fraction of a second, as compared with the same exposure of the original mask pattern which can take up to several hours. Usually a refinement of this procedure is used in which a stepper is used to expose the wafer by exposing one part of the complete wafer pattern, then stepping to the next and so on over the wafer surface.

Sometimes the mask or reticle pattern will be exposed at four times, or some other multiple of, the required final scale. The light exposure will then also include a reduction, or demagnification of the mask pattern by the scaling factor, so that the final pattern exposed on the wafer surface is the required size.

The exposed pattern in wafer borne photoresist will then be developed and used as a mask in itself for one step in the processing, for example ion implantation or metal vapour coating, of the semiconductor wafer towards the final target of manufacturing the microcircuit or chip. The complete wafer process will usually require about 20 such processing steps, each of which requires a different exposed and developed pattern. So a given wafer will require for full processing typically twenty masks or reticles.

In exposing electron resist on the surface of the mask or reticle the electron beam is deflected over the surface to produce serial, pixel by pixel exposure. This deflection can be produced either by so called 'vector deflection' methods, in which the beam is moved rapidly to an exposure region, a small region is exposed, and the beam is then moved directly on to the next exposure region, or by 'raster scan' methods. In raster exposure the beam is scanned over the complete surface in a raster pattern and is turned off or 'blanked' where exposure is not required.

The most commonly used method for high throughput mask production is the raster scan method. Since this requires that the beam be turned on for every pixel which is exposed, and off for every unexposed pixel, and since exposure patterns are unpredictable, the raster scan system must be capable of turning the beam on from off, or off from on, for every pixel. This results, for modern, high throughput raster scan systems, in a requirement that the beam blanker can run at repetition rates of 320 MHz and higher.

Fast beam blankers required for high blanking repetition rates such as this are almost always of the deflection blanking type. In this type the electron beam passes between one or multiple deflection plate pairs each of which is usually disposed symmetrically about the column axis and is blanked by deflecting it off the axis. An aperture with its central hole disposed on the column axis will stop, or blank, the beam when this deflection is greater than the radius of the hole.

Each plate pair consists of two conductors. Each conductor in the pair will have a plane inner surface, or a singly or multiply curved or other compound inner surface. A potential difference, known hereinafter also as a voltage, will be applied between the two plates so that an electric field exists in the space between the plates, through which the electron beam proceeds. An electron passing through this field will be deflected by the electric field. That deflection will carry the electron away from the column axis and when the deflection is large enough the beam will be stopped on the outer regions of the aperture.

The velocity of an electron which passes through this space between the plates is finite and dependent upon the voltage through which it has been accelerated before it emerges from the electron gun. If the time taken by the electron to pass through the space between the plates in which the deflection field exists is comparable with, rather than very short compared with, the time for which the beam is blanked off during pattern exposure, then operational problems can arise. The focused electron beam at the mask surface can thereby move during blanking. Any movement during blanking affects the area of resist exposed during the pixel exposure and can therefore cause faults in the exposed pattern.

This problem has been addressed partially in the prior art, especially by the "horseshoe blanker". In this design two pairs of deflection plates are used, together with a blanking aperture disposed at the center of the whole structure, equidistant from each plate pair and on the beam axis. The center of the blanking aperture is made electron optically conjugate with the intersection of the mask surface and the column axis, by a succeeding electron lens. The upper plate pair and the lower plate pair are both portions, also, of a parallel strip transmission line which proceeds horizontally past the column axis, then bends around in an arc and returns horizontally back past the column axis, parallel with its top section, in other words in a horseshoe shape. The blanking voltage pulse is applied to the beginning (top) of the horseshoe and proceeds along the transmission line to the end (bottom) of the horseshoe thus passing the column axis twice. The propagation time of the blanking voltage pulse along this transmission line from the top column axis intersection to the bottom column axis intersection is designed to equal the time taken by an electron to travel by its more direct route, close to the column axis, from the top intersection to the bottom intersection.

In the steady state, with a DC voltage applied between each plate pair, the top pair deflects the beam off the axis by a given angle and the bottom pair deflects the beam further in the same direction by an equal angle. Thus, in the steady state, with a deflection voltage applied, the focused beam at the mask surface remains in the same place as with no voltage applied, since the angle of beam emergence from the bottom pair is such that it appears to originate from the center of the blanking aperture at all values of the deflection field and the center of the blanking aperture is conjugate with the intersection of the mask surface and the column axis.

The horseshoe blanker solves the problem only partially however, since each electron travels at a finite speed and takes a finite time to pass through each of the two plate pairs. The result is that an electron can suffer different amounts of deflection which depend upon where the electron was within the plate pair when the blanking voltage pulse started and stopped. This means that the deflection suffered in the second plate pair may be greater or less than the deflection it suffered in the first plate pair. This, in turn means that the electron will not usually appear to emerge from the center of the blanking aperture, its point of origin will not be conjugate with the mask surface/column axis intersection and it will not therefore go to the correct place on the mask surface. Therefore the focused spot on the mask surface will move during blanking and the exposed pattern will be spoiled.

Further limitations of the horseshoe blanker are as follows.

At 320 MHz blanking repetition rate the transmission line of the horseshoe blanker is no longer immune to parasitic capacitance and inductance especially those which occur between the top and bottom arms of the horseshoe. Such parasitics cause distortion of the waveform as it travels along the transmission line. If the deflection voltage waveform at the bottom plate pair is different from that applied at the top plate pair this also causes movement during blanking.

At 320 MHz blanking repetition rate, reflections and losses at the vacuum wall located plug and socket transitions between electronic blanking driver and the transmission line cause distortions and differences between the voltage waveforms applied at the top and bottom plate pairs.

At 320 MHz the mechanical adjustment of delay which is required to match the delays of the electron and the blanking voltage pulse are unacceptably coarse.

There is a need for a new embodiment of the dual plate pair deflection blanking system to eliminate the movement of the focused beam at the mask surface during blanking due to the finite passage time of the electron past each of the plate pairs.

There is a need to make negligible any differences between the voltage waveforms applied at the top and bottom plate pairs.

There is a need to provide means of fine delay adjustment which allows for blanking deflection repetition rates of 320 MHz and above.

SUMMARY OF THE INVENTION

In accordance with the above-stated needs, an electron beam blanking method and system are provided that substantially eliminate or reduce disadvantages and limitations of prior electron beam blanking methods and systems, including the reduction or elimination of blanking jitter.

One aspect of the present invention is an electron beam blanking method and system that selectively interrupts the flow of electrons during an electron beam lithographic process while minimizing electron beam movement during blanking as the electron beam reaches a target lithographic mask. The invention includes a first deflection plate pair that deflects electrons flowing in the electron beam in the direction of the target lithographic mask. The first deflection plate pair includes a first tapered gap that is formed so that electrons of an electron beam which enter the first tapered gap before the initialization of a blanking voltage experience progressively greater electric field as they pass through the plates for controlling the cumulative deflection as the electrons travel through the first deflection plate pair. A second deflection plate pair deflects electrons flowing in the electron beam in the direction of the target lithographic mask and includes a second tapered gap for further variably controlling the commutative deflection of the electron beam traveling through the second tapered gap. An aperture separates the first and second deflection plate pairs. One or more hybrid integrated circuits provide deflection power to the first and second deflection plate pairs for varying the respective degree of electron beam deflection.

A technical advantage that the invention provides is making the angular deflection that is applied by each set of deflection plates to each electron in the beam essentially identical to within the paraxial approximation. Accordingly, all electrons appear to emerge from the blanking aperture and properly focus on the electron beam lithographic mask without undesired movement and inappropriate exposures of the underlying substrate.

A further technical advantage of the present invention is that it eliminates the differences which arise in prior art blanking systems due to parasitic conductances between a top set of deflection plates and a bottom set of deflection plates.

The present invention avoids the horseshoe path that the deflection voltage takes as it passes along the horseshoe blanker and the parasitic conductances between one part of the horseshoe blanker and another and between all parts of the horseshoe blanker differently to surrounding metal parts. The present invention achieves this result by eliminating the horseshoe section that appears in the prior art devices and applies the voltage waveform separately to a top or first deflection plate set and then to a bottom or second deflection plate set.

The present invention renders the detrimental effects of the finite time of travel of the electrons past each of the two sets of deflection plates negligible or possibly zero.

Yet another technical advantage of the present invention is improved ease and accuracy of the adjustment of delay between the application of the deflection fields to the top plates and to the bottom plates. The present invention achieves this result by using electronic adjustment methods rather than mechanical adjustment methods for setting delay.

Moreover, the present invention provides the technical advantage of stability even at blanking frequencies of up t to 320 MHz. As blanking frequency goes up, all of the other problems get worse. The present invention obtains stable performance at maximum blanking frequency by taking the above-described measures at least in part because it eliminates the parasitic conductances that exists in prior art systems.

BRIEF DESCRIPTION OF THE DRAWINGS

For a more complete understanding of the present invention and the advantages thereof, reference is now made to the following description which is to be taken in conjunction with the accompanying drawings in which like reference numerals indicate like features and wherein:

FIG. 5 is another, side cut-away view of a portion of the electron beam lithography system appearing in FIG. 1 to illustrate more particularly the configuration of one embodiment of the present invention;

DETAILED DESCRIPTION OF THE INVENTION

Preferred embodiments of the present invention are illustrated in the FIGS. wherein like numerals refer to like and corresponding parts of the various drawings.

Figure 1:
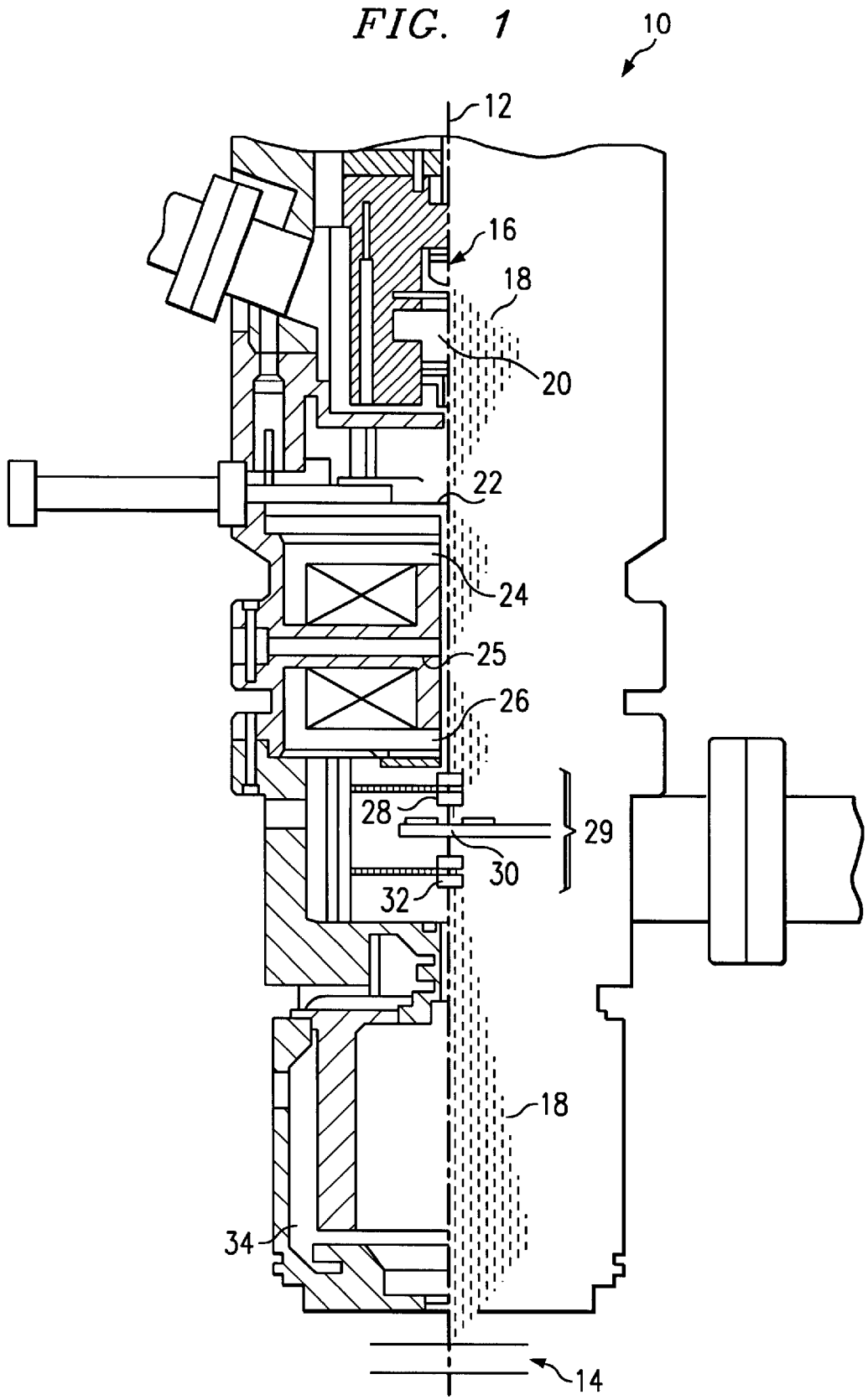
FIG. 1 shows a side cut-away schematic view of an electron beam lithography system incorporating the teachings of the present invention.

For general understanding of the invention, it is helpful to see the relationship for the blanker to the other elements of an electron beam lithography column. To that end, FIG. 1 shows a side cut-away schematic view of electron beam lithography system 10 incorporating the teachings of the present invention. Electrons are provided in the column by a cathode which is a thermal field emission electron source 16 much as described in U.S. Pat. No. 3,374,386 entitled FIELD EMISSION CATHODE HAVING TUNGSTEN MILLER INDICES 100 PLAIN COATED WITH ZIRCONIUM, HAFNIUM OR MAGNESIUM ON OXYGEN BINDERS, ISSUED TO CHARBONNIER, et al., in 1968. FIG. 1 shows only half of the column cross-section on the left-hand side of dash line 12. On the right-hand side of dash line 12 appears the electron beam divergence and convergence path en-route to target lithographic mask 14, however, with the lateral dimensions vastly exaggerated. The electron beam appearing in FIG. 1, therefore, is fairly realistic assuming that the lateral dimension is scaled to several thousand times the scale of the vertical dimension.

In FIG. 1 electron beam lithography system 10 includes high reliability thermal field emission tip 16 that emits a beam of electrons that eventually flow in the direction of lithographic mask 14. From thermal field emission tip 16, electron beam 18 passes through magnetic lens 20 which focuses the beam at the center of electron beam lithography system 10 and directs electron beam 18 through system limiting aperture 22. Aperture 22 further aligns electron beam 18 with the optical axis to provide the proper beam shape before electrons enter blanking device 29.

After passing through system limiting aperture 22, electron beam 18 goes through first magnetic lens 24 and then through second magnetic lens 26 until it reaches upper plates 28 of electron beam blanking device 29 of the present invention. Upper deflection plate set 28 deflects electron beam 18 through blanking aperture 30. From blanking aperture 30, electron beam 18 passes through lower deflection plates 32 of the present invention, which realigns electronic beam 18 upon its exit from blanking device 29.

Figure 2:
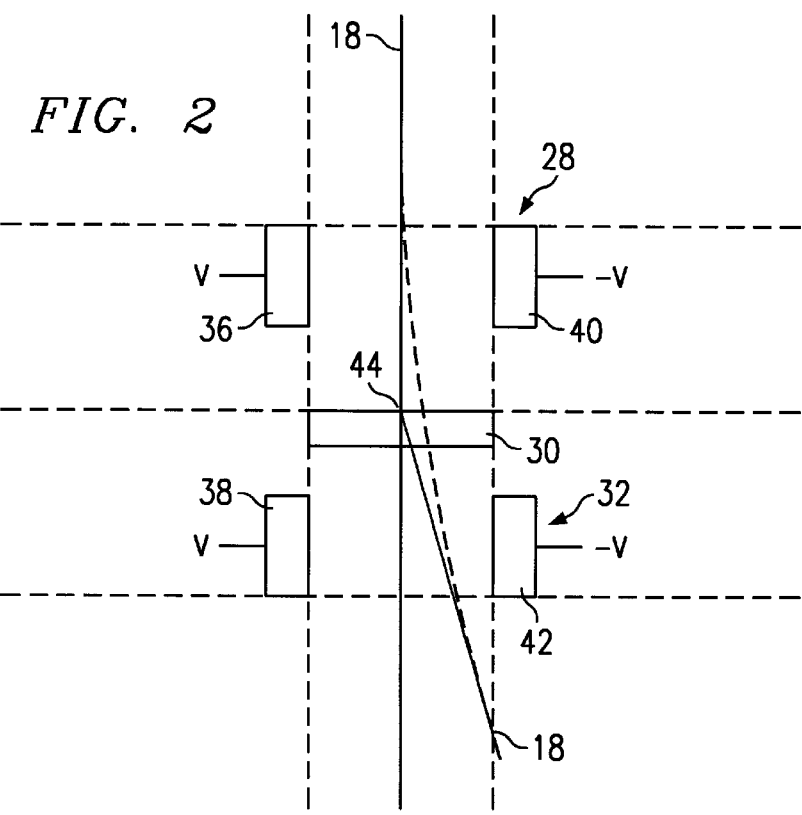
FIG. 2 illustrates conceptually the deflection function that the present invention performs.

FIG. 2 illustrates conceptually the deflection and beam blanking function that blanking device 29 performs. In FIG. 2, an equal voltage, V(t), is driven first positively to upper plate 36 of upper plate set 28 and then to lower plate 38 of lower plate set 32. The deflection voltage, V(t), is the applied negatively to upper plate 40 of upper plate set 28 and lower plate 42 of lower set deflection plate 32. Blanking aperture 30 is placed midway between plate set 28 and lower plate set 32. This causes electron beam 18 to appear as though it emerges from point 44 of aperture 30 which is the axial point located centrally between the centers of upper deflection plate set 28 and lower deflection plate set 32. The blanking aperture 30 blanks electron beam 18 as soon as its deflection causes it to fall completely outside the blanking aperture opening. Until electron beam 18 is completely blanked, however, it appears, at all deflection angles, to emerge from blanking device 29 as though from blanking aperture 30.

Figure 3:
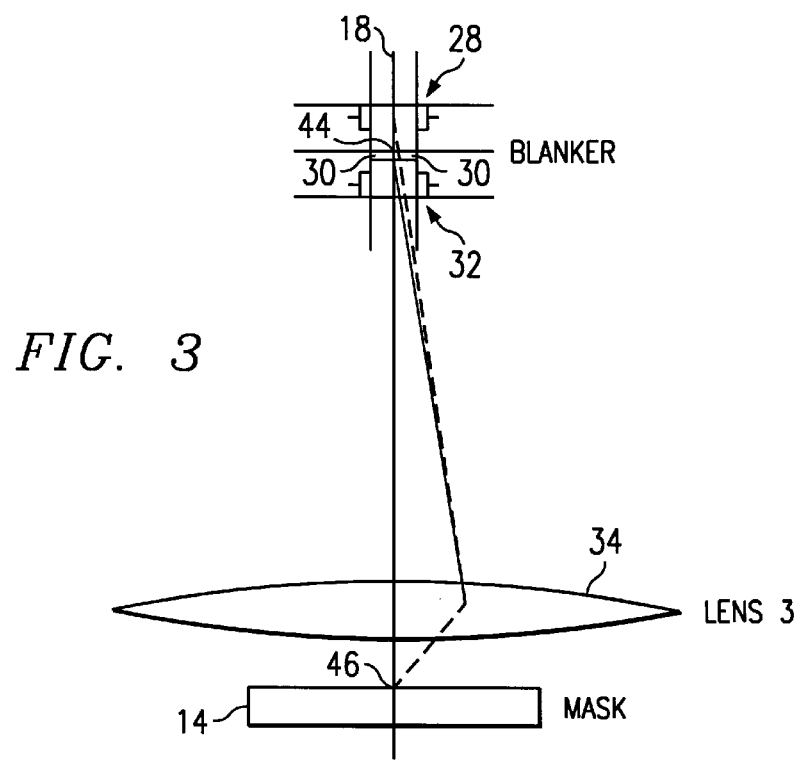
FIG. 3 depicts the magnetic focusing of an electron beam from the deflection system of the present invention to a lithographic mask for the purpose of electron beam lithography.

FIG. 3 depicts the magnetic focusing of electron beam 18 from electron beam lithography system 10 of the present invention to point 46 on lithographic mask. FIG. 3 illustrates the object of the present invention of assuring that the aperture 30 position is optically conjugate with the mask 14 surface so that point electron 46 on mask 14 remains stationary during blanking. Stated otherwise, the object at the blanking aperture is imaged at the mask 14 surface. Therefore, within the limits of a paraxial approximation of electron optics, any ray which appears to emerge from the blanking aperture is brought to the same image point in the mask plane, irrespective of the angle at which it emerges from lower deflection plate set 32.

Figure 4:
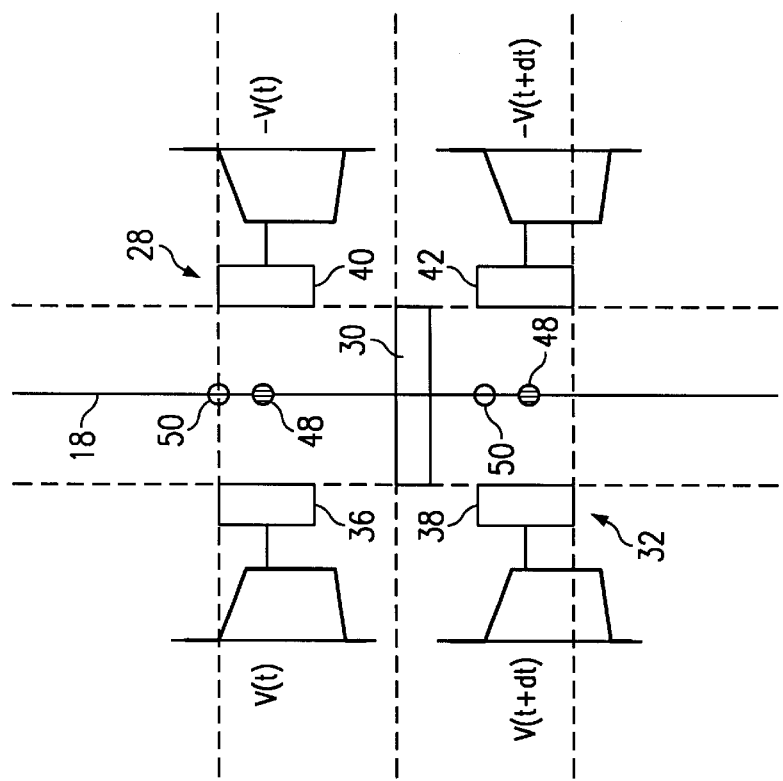
FIG. 4 provides a time-related diagram for explaining the electron beam jitter limitation that the present invention addresses.

FIG. 4 provides a time-related diagram for explaining the limitation of blanking jitter that conventional blanking systems cause by virtue of the electron flow through the deflection plates. FIG. 4 illustrates, at two different times, t and (t+dt), the flight of two electrons 48 and 50 through upper deflection plate set 28, first, and then through lower deflection plate set 32. The time, dt, represents the time of flight for an electron between the center of upper deflection of plate set 28 and lower deflection plate set 32. Consider that electron 48 enters both upper deflection plate set 28 and lower deflection plate set 32 well before the voltages±V(t) and the ±V(t+dt), respectively, start to rise. Consider further that electron 50 enters upper deflection plate set 28 as V(t) and −V(t) start to grow. Electron 48 enters upper deflection plate set 28 well before ±V(t) starts to grow. After time increment, dt, electron 50 enters lower deflection plate set 32 well before ±V(t+dt) starts to grow. In each case, electron 48 is approximately half of the way through the plates before ±V(t) starts to apply a deflecting field.

Electron 48 is, therefore, deflected by a lesser amount in each set of plates than is electron 50. In this case the condition defined by FIG. 2, i.e., that the electron emerging from the horseshoe blanker appears to emerge from the blanking aperture, cannot be true of both electron 50 and the electron 48. If electron 50 appears to emerge from blanking aperture 30, then electron 48 must appear to emerge from a different and lower point on the axis of the column since it has suffered less deflection. This second axial point cannot also be made conjugate with mask 14 surface. Therefore, electron beam 18 appears to move at the mask 14 surface during blanking by an amount which is determined by the transit time past upper deflection plate set 28 and lower deflection plate set 30, and thus by the length of the deflection plates. The deflection plate set length is also the width of the transmission line strips and cannot be varied without changing both the "deflection sensitivity," that is, the number of radians of deflection produced per volt of deflection voltage and the impedance of the transmission line.

FIG. 5 is a different side cut-away view of a portion of electron beam lithography system 10 than that of FIG. 1 to illustrate more particularly the configuration of one embodiment of the present invention. In particular, FIG. 5 shows that upper deflection plate pair 28 connects hybrid circuit 52 and receives the voltage for deflecting electron beam 18 as it flows through aperture 30. From aperture 30, electron beam 18 then flows to lower deflection plate pair 32 to which voltage is supplied by hybrid circuit 54.

Hybrid circuit 52 includes a two millimeter thick ceramic layer which has the electronic drive output circuit on its lower surface to provide deflection voltages, V(t) and −V(t), to the top plate pair, and a ground plane on its top surface. The electronic drive circuit is a "hybrid" circuit using thick film deposited conductors, together with other active semiconductor devices. Whereas, most electron beam equipment which uses deflection blanking uses a single pair of blanking plates, the present invention, in contrast, preferably uses two pairs of blanking plates driven respectively by drive electronic hybrid circuits 52 and 54 with aperture 30 at the midpoint. The connection to each of the two deflection plates of the top pair is made directly from hybrid circuit 52 with no trailing leads in order to minimize uncontrolled parasitic impedances. Similarly each plate of the bottom pair is connected directly to the hybrid circuit 54.

The delay between the drive voltages applied, respectively, to upper deflection plate set 28 and to lower deflection plate set 32 can be set and adjusted by various means. An example is the use of a fixed transmission line delay plus an additional small trimmable delay using variable capacitance diodes. Trimming may be carried out by changing the bias on the diodes. Hybrid circuit manufacturing and trimming techniques can be made sufficiently precise so that the upper deflection plate set 28 drive voltage waveforms and the lower deflection plate set 32 drive voltage waveforms can be made identical to within very close tolerances.

Figure 6:
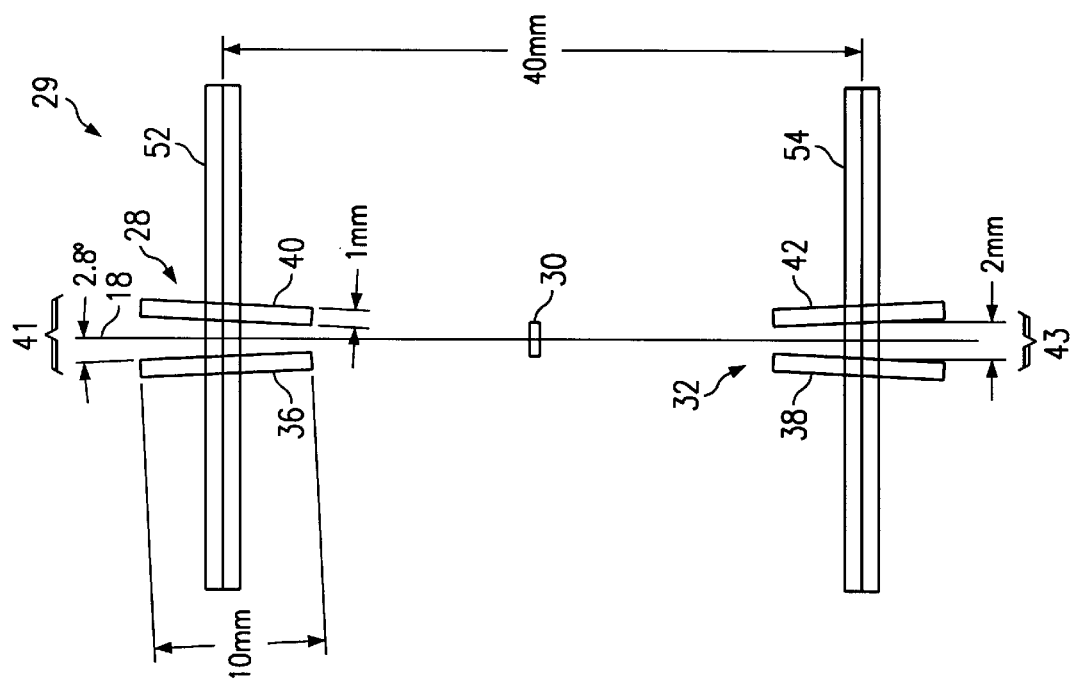
FIG. 6 shows a dimensional drawing of important elements of the present invention to more particularly illustrate one embodiment of the present invention.

FIG. 6 shows a dimensional drawing of important elements of the preferred embodiment to more particularly illustrate novel aspects of the present invention. In particular, as previously described, electron beam 18 passes through upper deflection plate set 28 which hybrid circuit 52 drives. As electron beam 18 passes through aperture 30, it proceeds further to lower deflection plate 32 which hybrid circuit 54 drives. FIG. 6 illustrates that instead of upper deflection plate 36 being parallel to upper plate 40, each of these plates cants or tapers slightly. In this example the degree of taper is 2.8 from parallel with electron beam 18. Therefore, a greater separation exists between upper deflection plate 36 and upper deflection plate 40 as electron beam 18 enters upper deflection plate 28. A lesser separation between upper deflection plate 36 and upper deflection plate 40 exists as electron beam 18 exits upper deflection plate 28. Lower deflection plate set 32 is also canted or tapered, but in an opposite direction from upper deflection plate set 28. That is, lower deflection plate 38 is closer to lower deflection plate 42 as electron beam 18 enters lower deflection plate set 32. Lower deflection plate 38 is farther away from lower deflection plate 42 as electron beam 18 exits lower deflection plate 32.

The dimensions of FIG. 6 are in millimeters. With these dimensions the angle between each deflection plate and the axis is 2.8 degrees for both upper deflection plate set 28 and lower deflection plate set 32, with the total angle subtended by each set equaling 5.6 degrees. Thus, the amplitude of the angle between the top plates and between the bottom plates is equal, the sign of that angle is opposite.

It is critically important to this embodiment of the invention that the two planes within which the four inner surfaces of the top plate pair 28 and the bottom plate pair 32 lie, intersect with each other and with the column axis at the center of the blanking aperture.

With the blanking system of the present invention, the tapered gap between upper deflection plate set 28 is formed so that electrons which enter before the start of V(t) are subject to a progressively greater electric field as they go through the plates. The cumulative deflection for an electron traveling through the first half of upper deflection plate set 28 is less than the cumulative deflection for the electron which travels through the second half of upper deflection plate set 28 during the same period. The cumulative deflection for an electron traveling through the first half of the lower deflection plate set 32 is more than the cumulative deflection for the electron traveling through the second half of the lower deflection plate set 32 during the same period.

Figure 7:
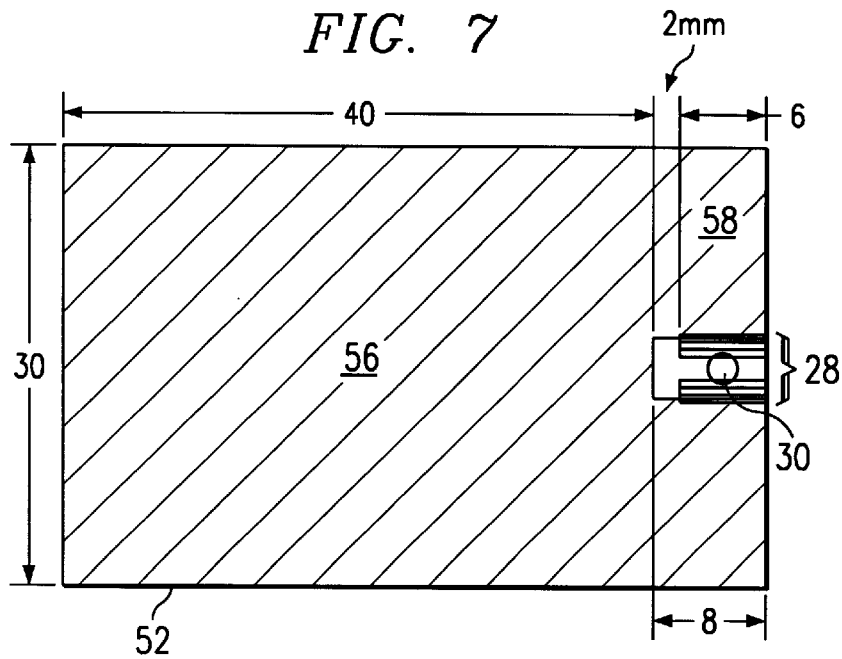
FIG. 7 shows a top-down view of a hybrid circuit that provides the electrical activation of the top set of deflection plates of one embodiment of the present invention.

FIG. 7 illustrates a top view of hybrid circuit 52 which drives upper deflection plate set 28. Hatched area 56 represent a plated support substrate with hybrid circuit on bottom surface and ground plane on top surface. Referring to both FIG. 6 and 7 dimensions which work well for one embodiment include deflection plate sets 28 and 32 having heights with approximately 10 millimeters with widths of approximately 1 millimeter. The average width between the tapered upper deflection plate sets 28 and lower deflection plate set 32 is 2 millimeters. In the present embodiment, a 40 millimeter spacing separates the axial centers of upper deflection plate 28 and lower deflection plate 32. FIG. 7 shows that hybrid circuit 52 may have a dimension of approximately 40 millimeters on one side with 30 millimeters on the adjacent side though these last two dimensions are not critical. The portion of hybrid circuit 52 including upper deflection plate set 28 maybe 8 millimeters with a 2 millimeter gap separating a 40 millimeter segment 56 from 6 millimeter segment 58.

It is important to note that the principal that tapered deflection plate sets 28 and 32 employ is general, rather than particular, to these dimensions. For a wide variety of dimensions, tapered gaps 41 and 43 which both project to an intersection at the center of the blanking aperture can be found for deflection plate sets 28 and 32, respectively, which will result in zero beam movement at the point conjugate to blanking aperture 30 during blanking. Blanking device 29 of the present invention can be mathematically explained by an analytical (algebraic) treatment such as the following.

Figure 8:
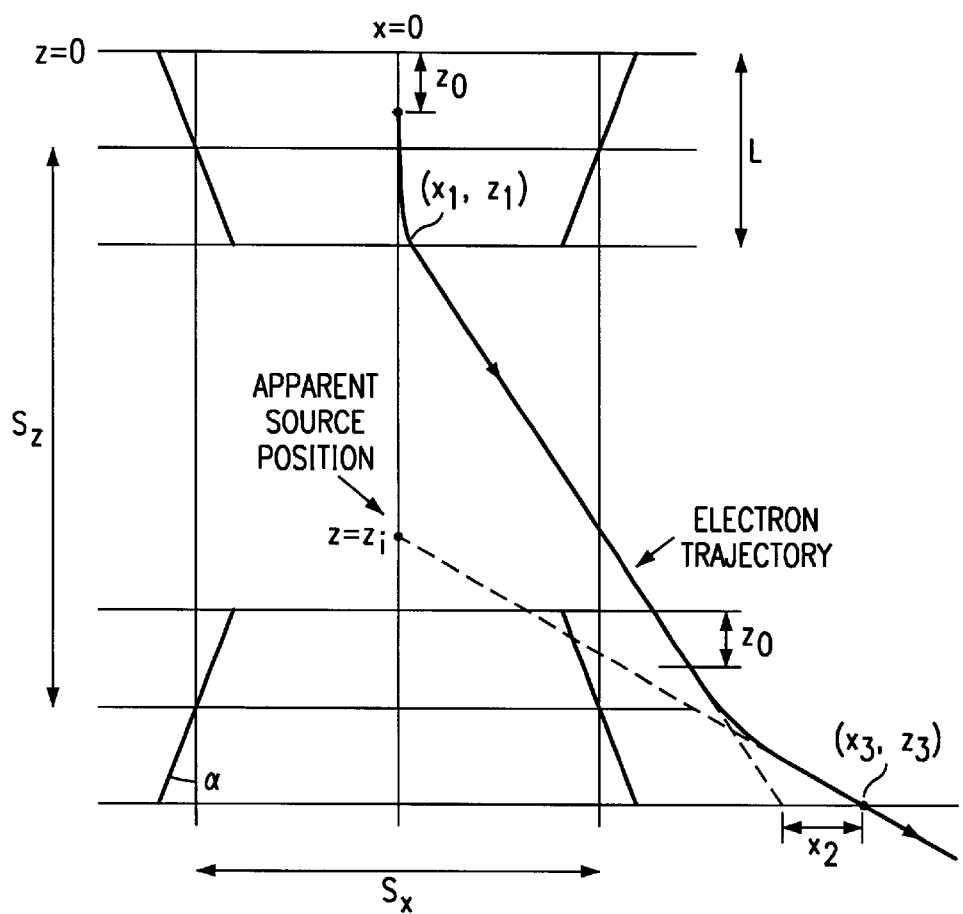
FIG. 8 conceptually illustrates the geometry of beam deflection that applies to the deflection that the present invention performs.

With reference to FIG. 8, consider that deflection plate sets 28 and 32 are very large in the y direction, and large enough in the z direction to ignore end effects. The deflection field is given by $$E = \frac{V}{x_p(z)}$$

where $x_p(z)$ represents the separation of the deflection plates in the x direction for any two plates. The deflection field is only in the x direction. The velocity of an electron in the z direction is constant and initially zero in the x direction.

The time delay between the upper deflection plate set 28 switching on and lower deflection plate set 32 switching on is exactly calibrated to the z velocity so that an electron moves the same distance, $z_o$, inside both pairs before the field comes on.

No relativistic corrections are used, so the classical speed of an electron accelerated through 10 eV is 0.2c, and the correction is approximately 4%.

Now, $$E_x = \frac{E_0}{1 + K\left(z - \frac{L}{2}\right)}$$

where K is a measure of the tilt of the deflection plates from the axis, and $E_0$ is the electric field at the center of the deflection plate set (z=L/2). The deflection force $$eE = M_e \frac{dv_z}{dt}.$$

This means that $$d\frac{v}{dt} = B[1 + K(v_z t - r)]^{-1},$$

where $$B = \frac{E_0 e}{M_e}$$

and $$r = \frac{L}{2}.$$

Note that $v_z$ is constant $\rightarrow z(t) = v_z t$ at all times.

Considering the behavior of electrons within the deflecting plate region when the electric deflection field is switched on, let the z position be $z_0$. At t=0 z=0, the field is switched on at a time, $$t_0 = \frac{z_0}{v_z}$$

The x velocity of electron can be found by integration of the following expression:

$$v_x(t) = B \int_{t_0}^{t_1} [1 + K(v_z t - r)]^{-1} dt \quad (1)$$

$$= \frac{B}{Kv_z}[\ln[1 + K(v_z t - r)] - \ln[1 + K(v_z t_0 - r)]]$$

Note that this expression equals zero for $t \leq t_0$. A further integration permits finding the trajectory of an electron within electron beam 18. Assume that x=0 for $t \leq t_0$.

$$x(t) = \int v_x dt = \frac{B}{Kv_z} \int \ln[1 + K(v_z t - r)] - \quad (2)$$

$$\ln[1 + K(v_z t_0 - r)] dt$$

$$= \frac{B}{Kv_z}\left\{\frac{1 + K(v_z t - r)}{Kv_z}[\ln(1 + K(v_z t_0 - r)) - 1] - \right.$$

$$\left. \ln[1 + K(v_z t_0 - r)]t\right\} + c$$

Now, at $t=t_0$, x=0. Therefore, $$C = \frac{-B}{Kv_z}\left\{\frac{1 + K(v_z t_0 - r)}{Kv_z}[\ln(1 + K(v_z t_0 - r)) - 1] - \ln[1 + K(v_z t_0 - r)]t_0\right\}$$

The above formulae permit predicting the exit velocity, $$v_x\left(\frac{L}{v_z}\right),$$

and exit point, $$x\left(\frac{L}{v_z}\right),$$

of an electron passing through a region of the deflection field generated by the tapered deflection plate sets 28 and 32 of the present invention.

With the present invention, deflection plate set 28 has an opposite angle of tilt to that of deflection plate set 32, so $K_1 = -K_2$. The above formulae permits predicting the change in velocity and change in x position due to deflection plate set 32.

Referring further to FIG. 8, let the exit point of an electron from deflection plate set 32 be at coordinate $(x_3, z_3)$. There will be three contributions to $x_3$. One contribution is from deflection plate set 28 and is represented by the term $x_1$. Another contribution is from deflection plate set 32, and is represented by the term $x_2$. Yet another contribution is from the uniform velocity imparted to the electron by upper deflection plate set 28 as the electron travels between the exit point of upper deflection plate set 28 and the final exit point at z=$z_3$. Accordingly, $$x_3 = x_1 + x_2 + v_{x_1} \quad (3)$$

where $$x_2 = x\left(\frac{L}{v_z}\right)$$

with K=−K, $$v_{x_1} = v_x\left(\frac{L}{v_z}\right),$$

and τ=time to travel between first and second exit points, $(x_1,z_1)$ and $(x_3,z_3)$. Note that $$\tau = \frac{S_z}{v_z},$$

where $S_z$ is the z separation between upper deflection plate set 28 and lower deflection plate set 32.

Expression (4) indicates the intersection of the backtracked ray at $(x_3,z_3)$ with the x axis. This intersection point, $z_i$, indicates the apparent source point for the electron beam after it has left the blanker. Thus, $$z_i = z_3 - \frac{x_3 v_z}{(v_{x_1} + v_{x_2})} \quad (4)$$

where $$V_{x_2} = V_{x_2}\left(\frac{L}{V_z}\right) \text{ with } K = -K$$

Note that the final x velocity of the electron as it exits lower deflection plate set 32 is the simple sum of the velocities imparted by the two pairs i.e. $V_{x,final}=V_{x1}+V_{x2}$ Through a somewhat complicated, but straightforward, analysis, it is possible to derive a simple form of $z_i$ as a function of K and $z_0$. Ascertaining $x_1$, involves inserting putting $$t = \frac{L}{v_z}$$

into the formula for x(t).

Note that now $$v_z t - \frac{L}{2} = L - \frac{L}{2} = r,$$

since $$r = \frac{L}{2}$$

and let $a=v_z t_0 - r = z_0 - r$. It can be shown that $$z_i = L + S_z - \frac{1}{K}(M + KS_2)\ln\left(\frac{M}{P}\right) + \frac{u\ln\left(\frac{u}{v}\right)}{\ln\left(\frac{M}{P}\right) - \ln\left(\frac{u}{v}\right)} \quad (5)$$

Where, $M = 1 + Kr \quad u = 1 - Kr$
$P = 1 + Ka \quad v = 1 - Ka$

This fairly simple expression predicts the apparent source of rays leaving the blanker arrangement. A value of K such that $Z_i$ becomes independent of $Z_0$ can be obtained by setting $M+KS_z=-u$, which leads to immediate cancellation of all terms involving $Z_0$, i.e., P and V. In this case, $$z_i = L + S_z + \frac{u}{K}.$$

Now, $M+KS_z=-u$. Therefore, $$K = \frac{-2}{S_z},$$

so $$z_i = \frac{L + S_z}{2} \quad (6)$$

That is, when K is set appropriately, $z_i$ will always be the above value, independent of $z_0$. Moreover, K is related to the angle of tilt, α, by $$K = \frac{2\tan}{S_z}$$

Therefore, in the $z_0$ independent situation, $$\tan = \frac{S_x}{S_z}$$

Note that the geometry of the arrangement of FIG. 8 implies that this situation corresponds to both upper deflection plate set 28 and lower defection plate set 32 pointing toward the midpoint between the plate pairs.

The above analysis considers the effect on an electron within the blanking plates of the electric field switching on. The converse effect is also important, i.e. the effect of the filed switching off.

The expression for $z_3$ will change slightly defining the point $(X_3, Z_3)$ to be the point at which the field switches off in the second plate pair, i.e., $z_3=S_z+z_0$. As before, $$x_3 = x_1 + x_2 + \frac{V_{xI} S_z}{V_z},$$

with $x_1$ etc. is determined using the new integrals. Therefore, the formula corresponding to equation (5) above, is $$z_i = S_z + z_0 - \frac{(p + S_z L)\ln\left(\frac{P}{u}\right) + v\ln\left(\frac{V}{M}\right)}{K\left[\ln\left(\frac{P}{u}\right) - \ln\left(\frac{V}{M}\right)\right]} \quad (5')$$

predicts the apparent source point for an electron that has traveled a distance $z_0$ within the blanker plates before the field switches off. Finally, for the situation that the same condition for K $$\left(\text{i.e., } K = \frac{-2}{S_z}\right)$$

leads to independence of $z_i$ of $z_0$. So $$K = -\frac{2}{S_z}$$

means that $$p + S_z K = -1 - \frac{2a}{S_z},\qquad \text{i)}$$

and $$v = 1 + \frac{2a}{S_z} \qquad \text{ii)}$$

Since $p+S_zK=-v$, it can be shown that $$z_i = \frac{S_2 + L}{2} \qquad (7)$$

This confirms that $z_i$ is the same as in the first analysis and indeed is independent of $z_o$.

Figure 9:
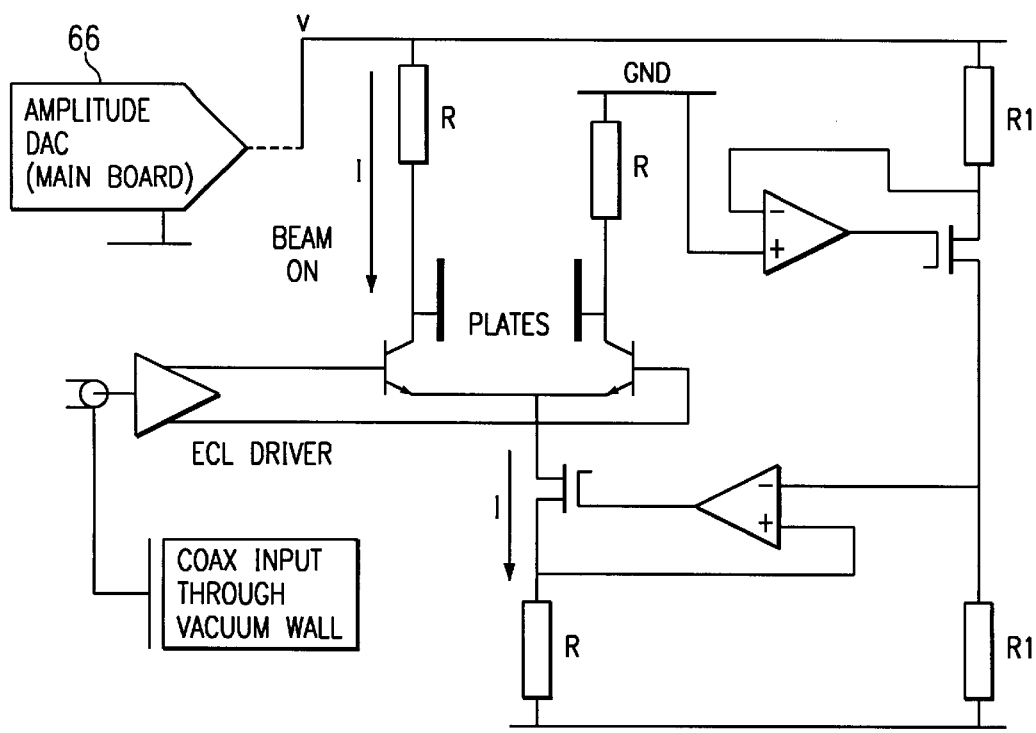
FIG. 9 provides a block diagram for a hybrid circuit providing the desired trimmed deflection voltage power for the present invention.

FIG. 9 illustrates one embodiment of hybrid circuit 64 that includes amplitude digital-to-analog converter 66 for providing voltage V to deflection plate 36 and to deflection plate 40. When electron beam 18 is to be "on" for exposing target 14, current flows through resistor 68, because ECL driver 70 drives transistors 72 and 74, thereby setting both plates 36 and 40 at ground potential. With both plates 36 and 40 at ground potential, no beam deflection occurs. In the beam off condition, deflection plate 36 is at V volts because ECL driver circuit 70 does not drive transistor 72, while deflection plate 40 is at −V volts. This results in a deflection voltage differential of 2×V volts, which is sufficient to cause the desired deflection of electron beam 18.

An important aspect of the present invention is that both upper deflection plate set 28 and lower deflection plate set 32 may be digitally controlled to permit hybrid circuits 64 operate each set independently and sequentially. Accordingly, the time delay between sending deflection voltage first to deflection plate set 28 and then to deflection set 32 may be precisely calibrated. The calibration flexibility possible with the present invention, therefore, far exceeds that of the prior art horseshoe blanker systems. Prior art horseshoe blankers are physically limited by the electron transit time from the upper portion of the horseshoe shape to the lower portion of the horseshoe shape as the upper deflection plate sets and then lower deflection plate sets are energized in those systems. But this limitation does not exist in the present invention.

Figure 10:
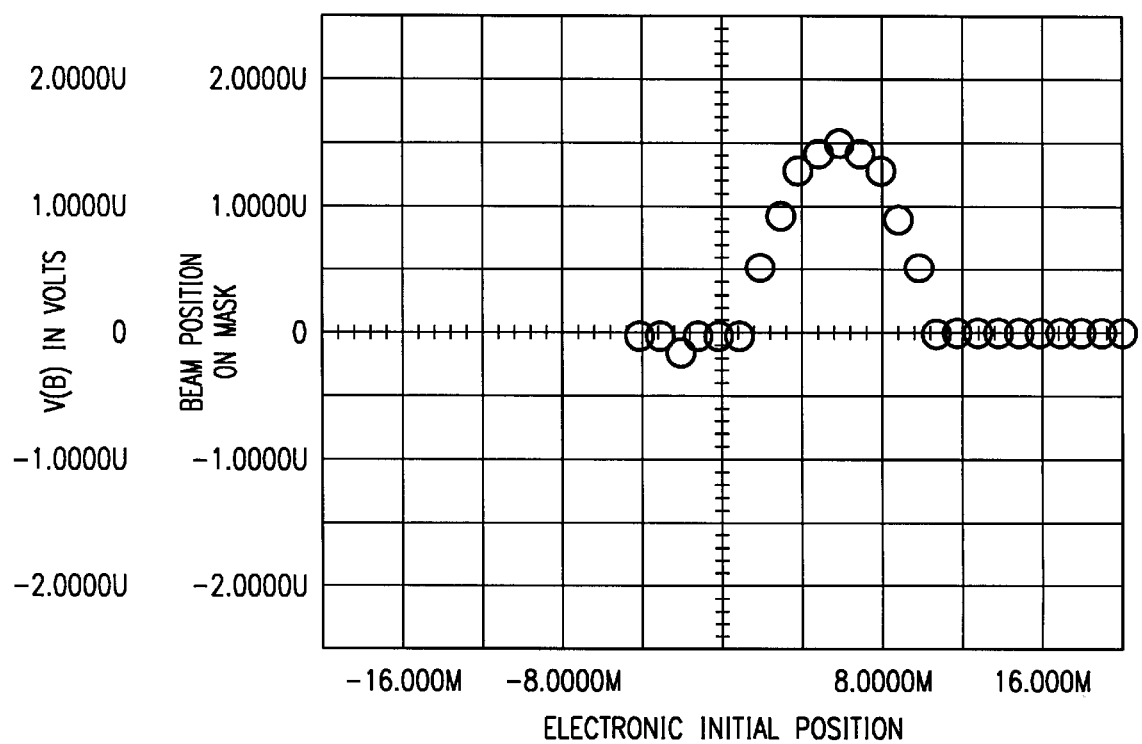
FIGS. 10 through 19 illustrate simulation results that show the operation of the present invention.

Some simulation results follow which show that the horseshoe blanker is capable of some mitigation, but not the elimination, of the amount of beam movement during blanking. This is brought about by changing the delay of the blanking voltage waveform from top plat pair to bottom plate pair away from exact equality with the delay of the electron traveling from top plate pair to bottom plate pair. FIGS. 10 through 19 illustrate simulation results that show how the horseshoe blanker integrates the forces acting on an individual electron. By starting electron beam 18 at a series of positions along the column axis at the initiation of the blanking pulse, as plot 60 of FIG. 10 shows, it is possible to determine the transient behavior of electron beam 18 at blanking aperture 30 and mask 14. First trials were made with a zero rise time blanking pulse, focused exactly at the center of blanker device 29 and with a blanker delay equal to the transit time between deflection plate sets 28 and 32 centers. A computer simulation carried out for electron beam lithography system 10 in the same way showed that blanking jitter reduced to zero. The simulation curve showed a straight zero line along the axis and is not reproduced here. There was no deflection of electron beam 18 during blanking, at the mask 14 surface.

Figure 11:
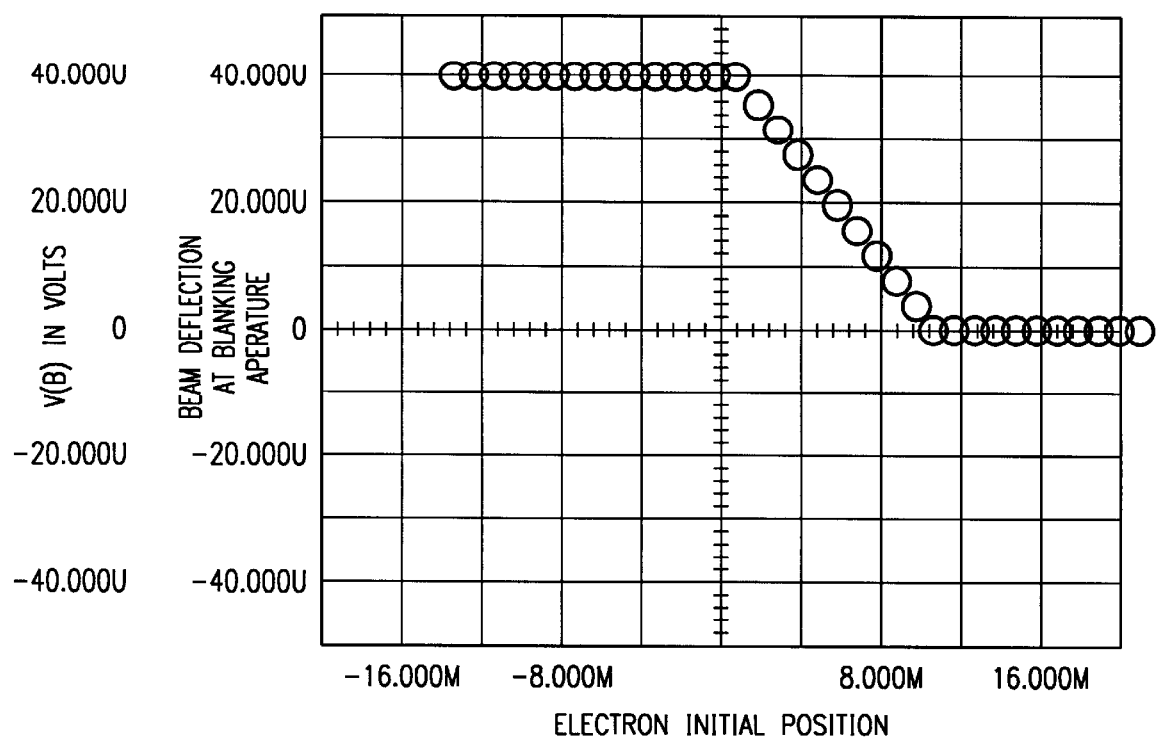
Figure 12:
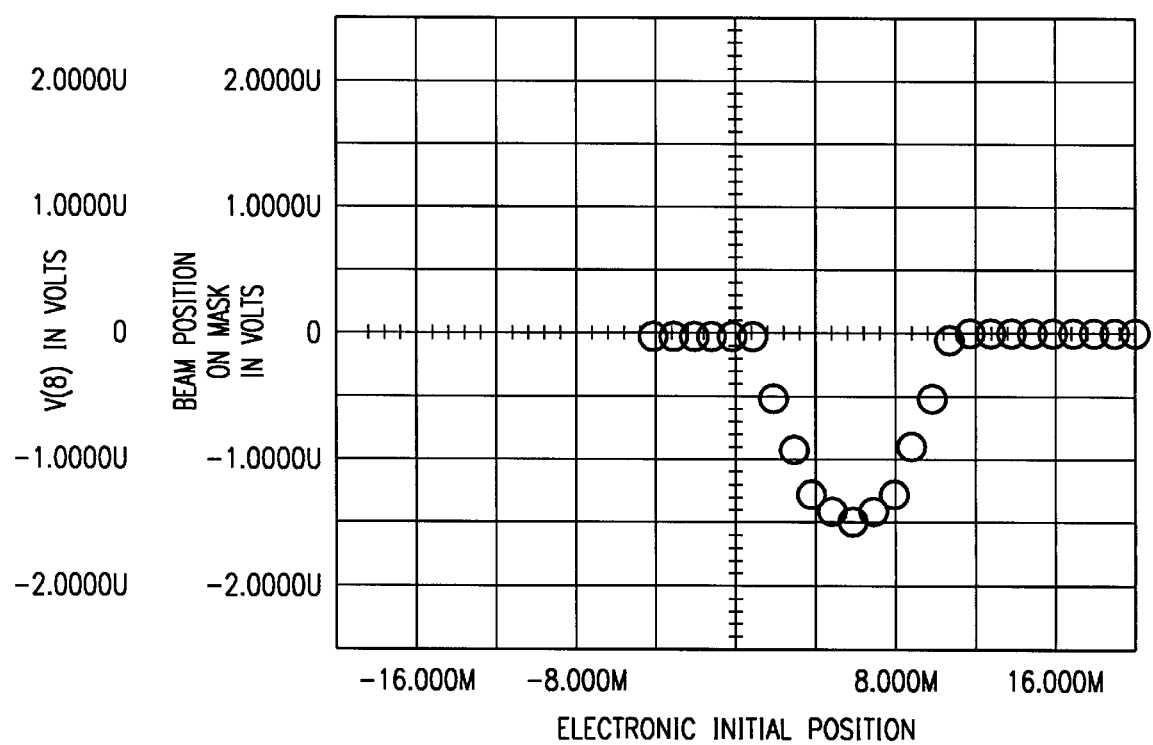
Figure 13:
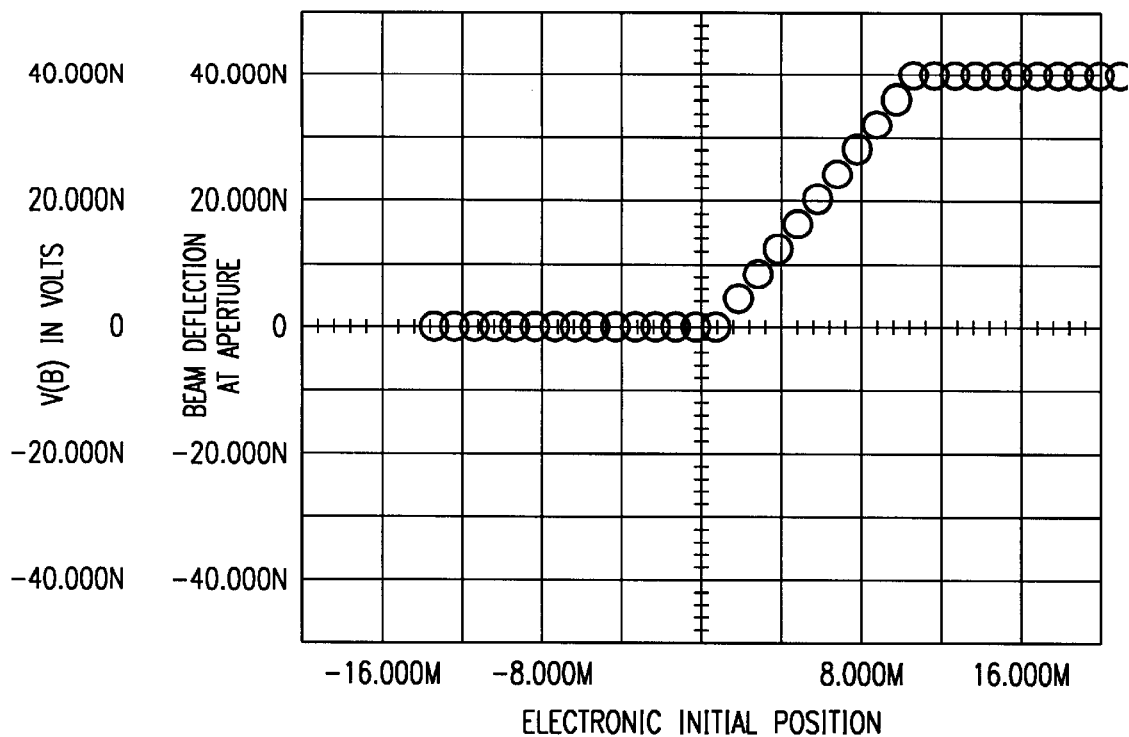

FIG. 10 shows the nominal blanker shift at the mask in the beam off-to-on transition. FIG. 11 depicts the beam off-to-on transition at the aperture. FIG. 12 describes the nominal blanker shift at the mask in the beam off-to-on transition. FIG. 13 shows the beam on-to-off transition at the aperture. The electron beam is blanked when the deflection at the aperture is greater than 25 mm. Considerable beam motion is seen at the mask plate under these conditions. Taking a realistic rise time of 300 picoseconds together with optimizing the blanker delay time gives these results shown in FIGS. 14 to 17 which are the best that can be obtained with the conventional horseshoe blanker.

Figure 14:
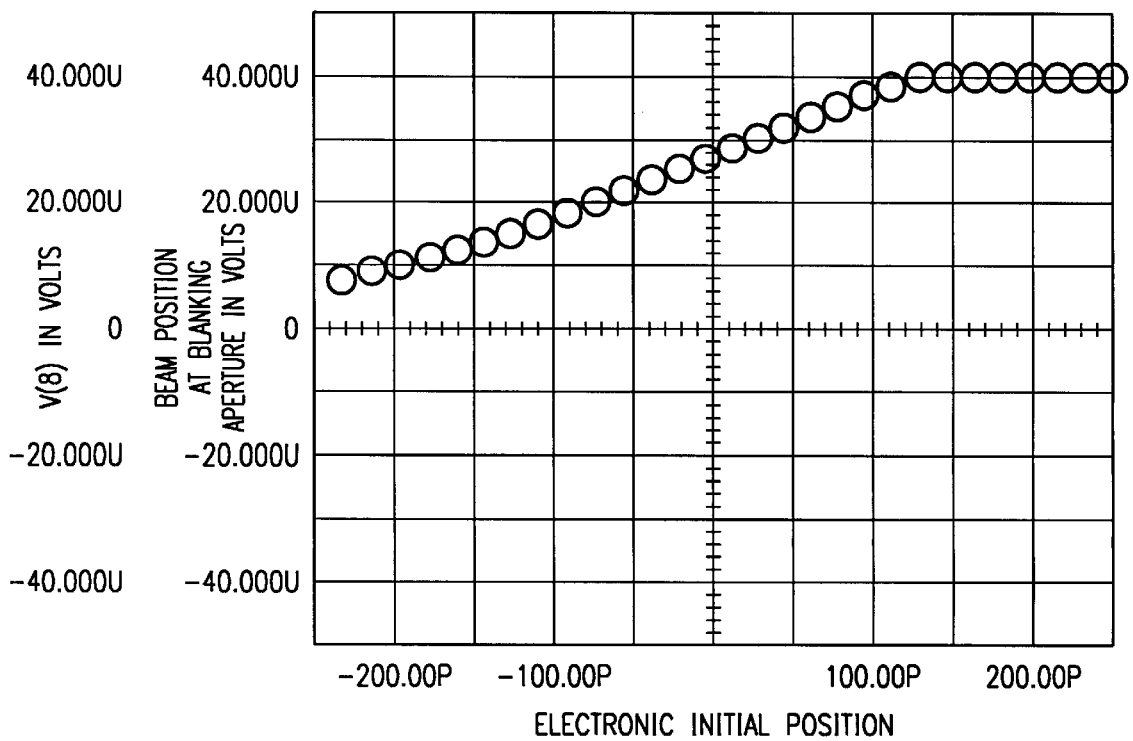
Figure 15:
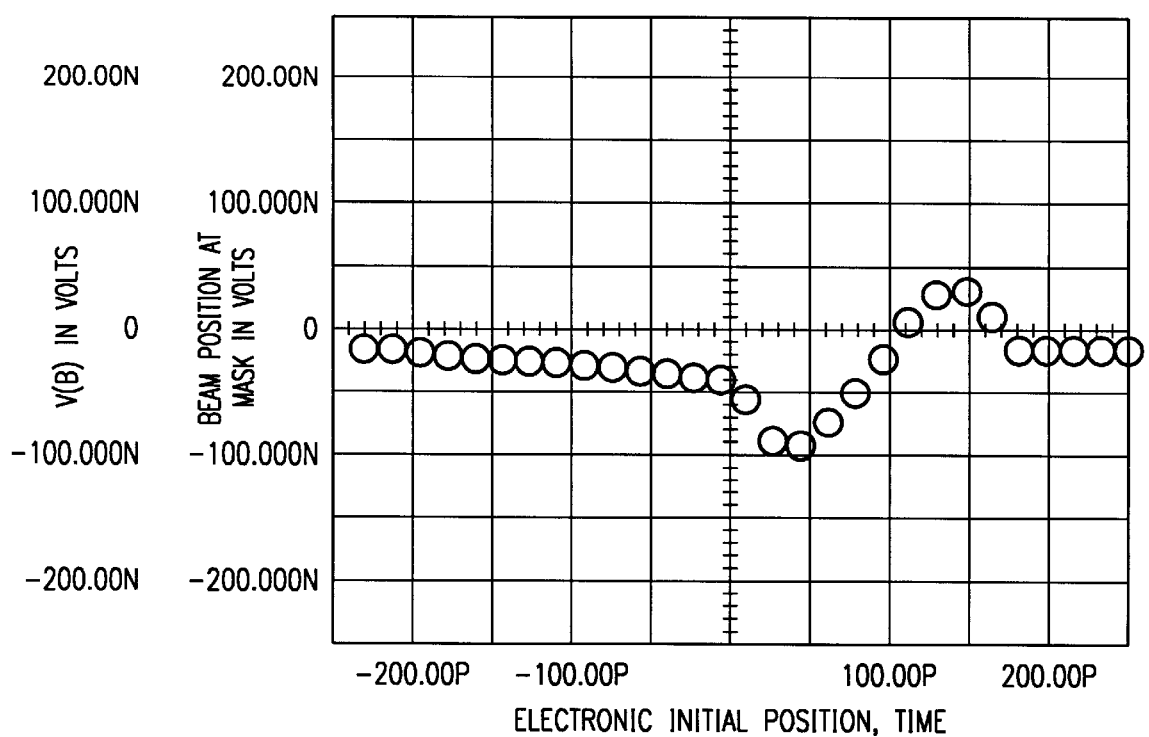
Figure 16:
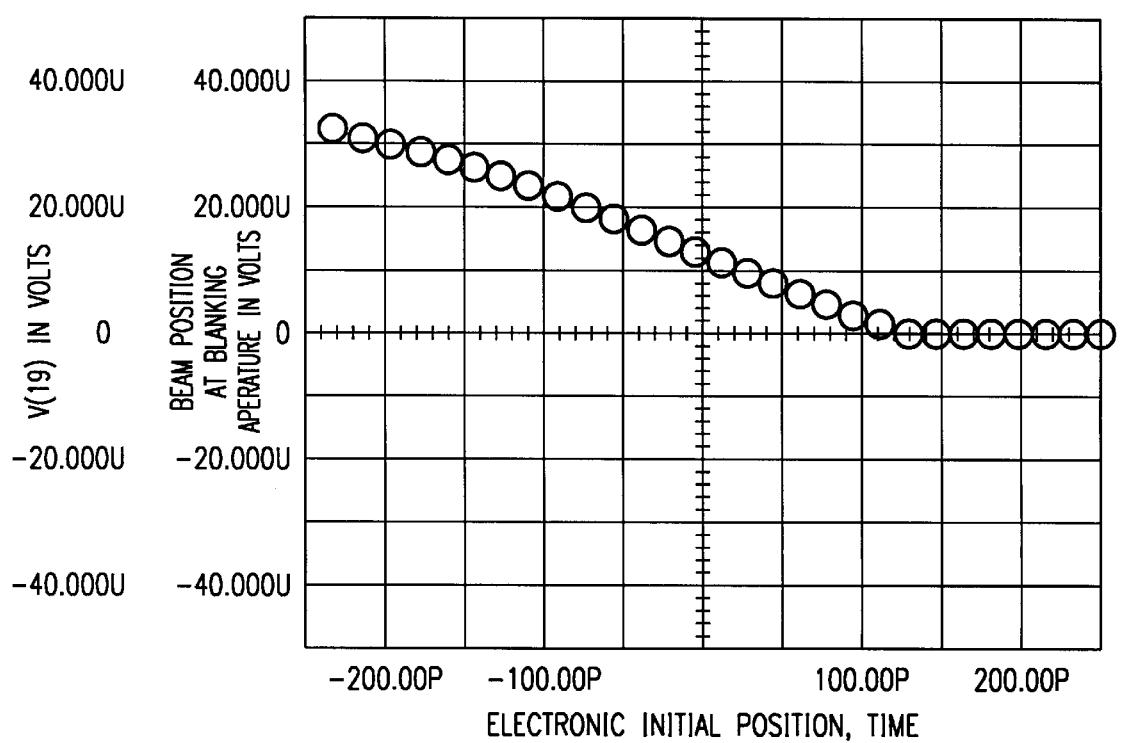
Figure 17:
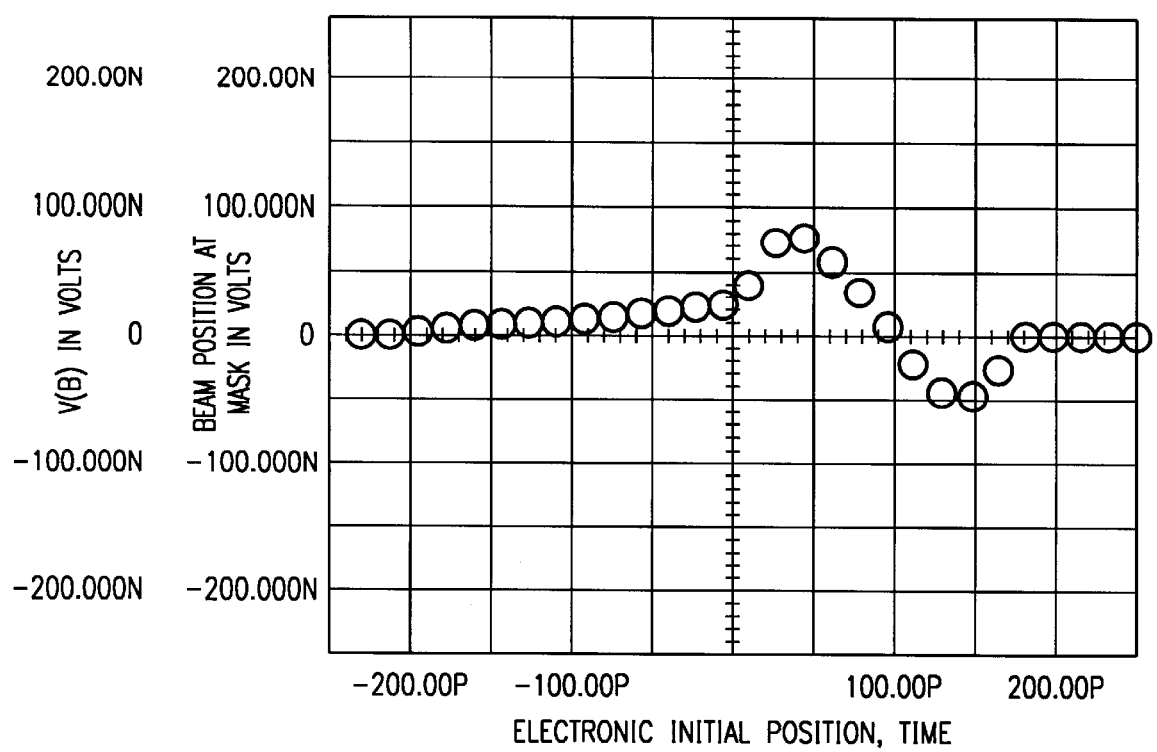

FIGS. 14 and 15 show the beam on-to-off transition using a 300 picosecond blanking pulse. FIGS. 16 and 17 illustrate the beam off-to-on transition using a 300 picosecond blanking pulse.

With the optimized delay, beam movement in the horseshoe blanker is much reduced and, for the on-to-off transition, occurs after blanking. Movement at the off-to-on transition is seen at the mask and is around 70 nanometers. The cause of beam movement is the shift of the apparent point of deflection for electrons that only transit part of the plates.

Figure 18:
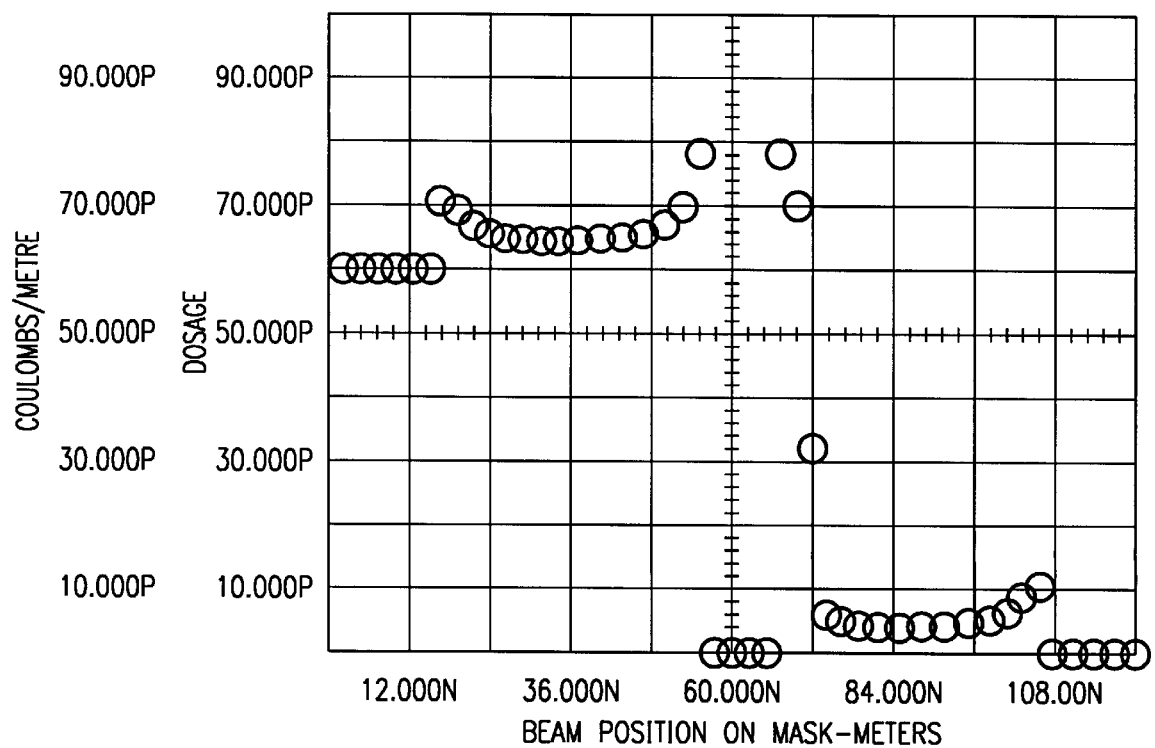
Figure 19:
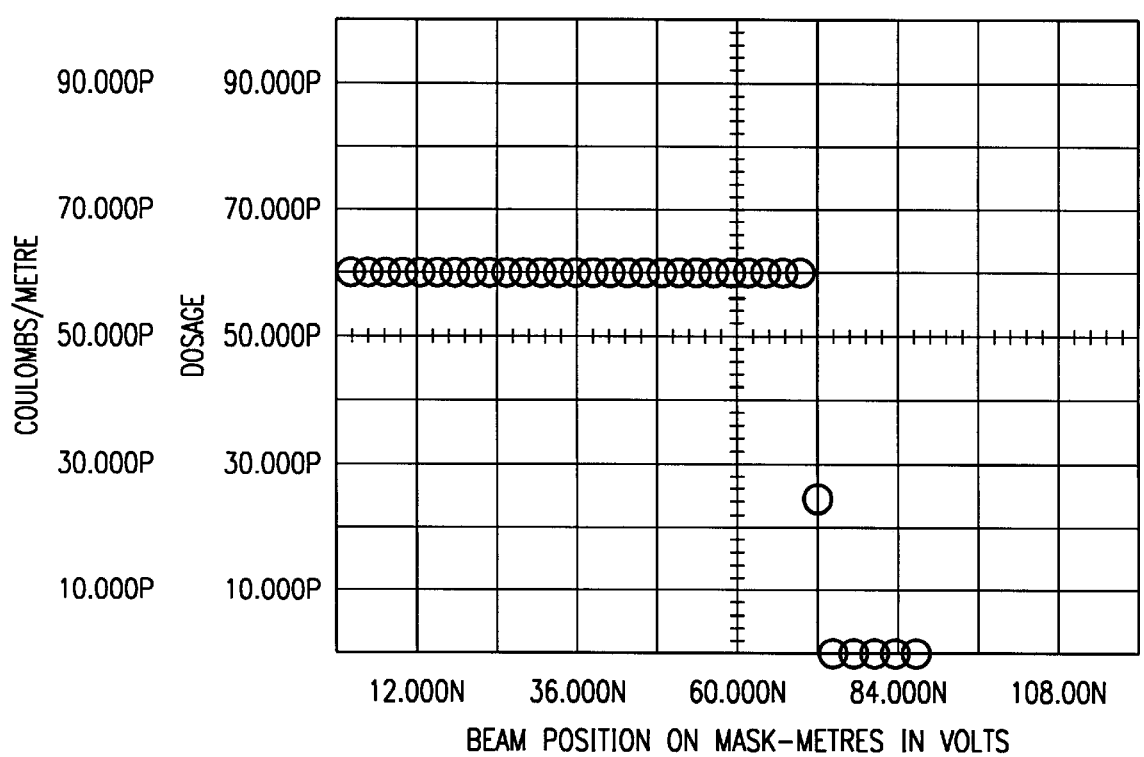

FIGS. 18 and 19 relate to blanker simulation dosage study that recorded the electron beam position at the mask plate against time. Whereas the prior art parallel plate horseshoe structure always produced some shift, the amount of shift could be minimized through adjustment of the blanker delay. The present invention, in contrast, is shown to give zero beam shift at the mask plate.

This study examined at the actual exposure dosage along the line when using a parallel plate blanker. The direction of blanker induced beam shift was determined by the alignment of the blanker assembly with respect to the write scan direction after allowing for lens rotation in magnetic lens 34. Since lens rotation is known and fixed the blanker can be arranged to deflect in the write scan direction so giving velocity modulation with no off axis exposure. This is the case considered. The write scan length used is 1 mm with 300 picosecond blanker rise time.

FIGS. 18 and 19 show dosage variation against the electron beam 18 position. Dosage is calculated as coulombs into a 2.4 nanometer linear line length for a 1 amp beam current. FIG. 18 shows dosage variation with a prior art parallel plate horseshoe blanker. FIG. 19 shows the dosage variation for the blanker of the present invention. The parallel plate blanker tends to shorten the feature by removing the dose over a 10 nanometer region at the end of the feature. This part of the dose is then spread over a 90 nanometer region at approximately 10% of nominal.

Although the invention has been described in detail herein with reference to the illustrative embodiments, it is to be understood that this description is by way of example only and is not to be construed in a limiting sense. For example, embodiments that provide fine x,y,z adjustments on the blanking aperture and some adjustments on the deflection plate pair positions will improve the chances of optimal operation of the blanker itself, but will also much improve the chances of aligning the column properly. It is to be further understood, therefore, that numerous changes in the details of the embodiments of the invention and additional embodiments of the invention, will be apparent to, and may be made by, persons of ordinary skill in the art having reference to this description. It is contemplated that all such changes and additional embodiments are within the spirit and true scope of the invention as claimed below.

What is claimed is:

1. An electron beam blanking device for selectively interrupting the flow of electrons during an electron beam lithographic process while minimizing electron beam movement daring blanking as the electron beam reaches a target lithographic mask, comprising:
   a first shielding aperture which constrains the electric fields generated within the succeeding component park to remain within the component part;
   a first deflection plate set for deflecting electrons flowing in the electron beats in the direction of the target lithographic mask comprising a first tapered gap for variably controlling the cumulative deflection of each electron in the electron beam which travels through said first deflection plate set;
   a second shielding aperture which constrains the electric field generated within the first deflection plate set to remain within the first deflection plate set
   a third shielding aperture which constrains the electric field generated within the succeeding second deflection plate set to remain within the second deflection plate set
   a second deflection plate set for deflecting electrons flowing in the electron beam in the direction of the target lithographic mask comprising a second tapered gap for further variably controlling the cumulative deflection for each electron in the electron beam traveling through said second tapered gap;
   a fourth shielding aperture which constrains the electric field generated within the preceding second deflection plate set to remain within the second deflection plate set
   an aperture separating said second shielding aperture and said third shielding aperture for blanking said electron bean, upon being deflected by said first deflection plate set; and
   circuitry associated with said first deflection plate set and said second deflection plate set for providing time varying deflection potentials to said first deflection plate set and said second deflection plate set for minimizing undesired deflection of the electron beam, thereby minimizing electron beam movement during blanking at the target lithographic mask.

2. The electron beam blanking device of claim 1, wherein said first deflection plate set is configured with said first tapered gap for deflecting each electron passing through the tapered gap by a linearly increasing amount, per unit of length and per unit of deflection voltage existing on the plate set, as the electron passes longitudinally through the gap from entry to exit, and thus producing a cumulative deflection for an electron which passes through an early portion of the plate set during a given period which is less than the cumulative deflection for an electron which passes through a later, equal length, portion of the deflection plate set during the same period.

3. The electron beam blanking device of claim 1, wherein said second deflection plate set is configured with said second tapered gap for deflecting each electron passing through the tapered gap by a linearly decreasing amount, per unit of length and per unit of deflection voltage existing on the plate set, as the electron passes longitudinally through the gap from entry to exit, and thus producing a cumulative deflection for an electron which passes through an early portion of the plate set during a given period which is less than the cumulative deflection for an electron which passes through a later, equal length, portion of the deflection plate set during the same period.

4. The electron beam blanking device of claim 1, wherein said first deflection plate set deflects said electron beam to not pass through said aperture for preventing electron from the electron beam from reaching the lithographic mask.

5. The electron beam blanking device of claim 1, wherein said second deflection plate set realigns said electron beam so that said aperture is electron optically conjugate with the surface of said target lithographic mask.

6. The electron beam blanking device of claim 1, wherein said first deflection plate set and said second deflection plate set cause essentially all electrons in the electron beam to appear to exit from within said aperture.

7. The electron beam blanking device of claim 1, wherein said circuitry further comprises a first hybrid circuit for controlling the deflection voltage of said first deflection plate set and a second hybrid circuit for controlling the deflection voltage of said second deflection plate set.

8. The electron beam blanking device of claim 1, wherein said first tapered gap is approximately equivalent in taper to said second tapered gap and each of these tapers projects to the same vertex at the center of the blanking aperture.

9. The electron beam blanking device of claim 1, wherein said circuitry further comprises a first hybrid circuit for controlling the deflection voltage of said first deflection plate set and a second hybrid circuit for controlling the deflection voltage of said second deflection plate set.

10. The electron beam blanking device of claim 1, wherein said first circuit is a hybrid circuit located on one surface of a ceramic support substrate for the first plate set, the other surface of which carries a ground plane and said second circuit is a hybrid circuit located on one surface of a ceramic support substrate for the second plate set, the other surface of which carries a ground plane.

11. The electron beam blanking device of claim 1, wherein said first hybrid circuit and said second hybrid circuit are laser trimmed to make their output deflection voltage waveforms as closely identical as possible.

* * * * *